(12) United States Patent     (10) Patent No.:    US 7,589,973 B2
Ong et al.     (45) Date of Patent:    Sep. 15, 2009

(54) AIR DUCT FLOW OPTIMIZATION DEVICE

(75) Inventors: Brett C. Ong, San Jose, CA (US); William A. De Meulenaere, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 145 days.

(21) Appl. No.: 11/899,302

(22) Filed: Sep. 5, 2007

(65) Prior Publication Data

US 2009/0059519 A1    Mar. 5, 2009

(51) Int. Cl.
*H05K 7/20*     (2006.01)

(52) U.S. Cl. .................. 361/719; 361/690; 361/694; 361/695

(58) Field of Classification Search .............. None
See application file for complete search history.

(56) References Cited

U.S. PATENT DOCUMENTS

| | | | |
|---|---|---|---|
| 6,452,797 B1 * | 9/2002 | Konstad | 361/695 |
| 6,657,860 B2 * | 12/2003 | Matsui et al. | 361/695 |
| 6,721,180 B2 * | 4/2004 | Le et al. | 361/695 |
| 7,342,786 B2 * | 3/2008 | Malone et al. | 361/695 |
| 2004/0022024 A1 * | 2/2004 | Le et al. | 361/695 |
| 2006/0232934 A1 * | 10/2006 | Kusamoto et al. | 361/697 |
| 2007/0236882 A1 * | 10/2007 | Chen | 361/695 |
| 2008/0002360 A1 * | 1/2008 | Cheng et al. | 361/690 |

* cited by examiner

*Primary Examiner*—Gregory D Thompson
(74) *Attorney, Agent, or Firm*—Osha • Liang LLP

(57) ABSTRACT

A device adapted to optimize air duct flow in an electronic system including a printed circuit board configured to support one or more electronic components having various heights. The device includes an air duct including a rigid cross-sectional member, the air duct being adapted to facilitate air flow from an inlet port to an outlet port. Further, the rigid cross-sectional member includes an opening having an interior perimeter, the interior perimeter of the opening being attached to a flexible sheet by a pressure sensitive adhesive. The rigid cross-sectional member attached to the flexible sheet is adapted to compress one or more electronic components to the printed circuit board when the rigid cross-sectional member is mounted on the printed circuit board, and is configured to form an airtight enclosure to optimize air duct flow.

17 Claims, 5 Drawing Sheets

Flexible "Skirt"

AIR DUCT FLOW OPTIMIZATION DEVICE

BACKGROUND

As the performance of computer systems increases, so does the amount of heat generated by various system components. Careful management of airflow is required to effectively cool computer systems down. The difficulty of cooling high power computer systems such as a computer server has grown as a result of demand for vastly more powerful processors combined with a similarly strong demand for smaller system form factors, such as a computer server enclosed in a 1 U housing.

Various structures and techniques may be used to effectively cool down a computer system. Heat is generated by the various system components and is removed to the surrounding air stream. Typical techniques for cooling involve fan-type assemblies mounted on or near heat-dissipating components, e.g., heat sinks. High-power processors create a demand for extremely efficient cooling devices, particularly in systems contained within constraints of dense form factors. Typically, an air duct is used to direct airflow with little air leakage to direct high-pressure air from system fans through processor heat sinks. For example, heat sinks may have a very high fin count in a compact geometry so the pressure drop across the heat sink is significant. As a result, small leaks in the air duct result in diversion of cooling air and poor thermal performance.

Conventional air ducting structures for servers have traditionally required elaborate and expensive plastic parts with fasteners, as shown in FIG. 1, designs which are inflexible to changes in system designs and involve many months of development time prior to deployment. A conventional plastic or metal air duct typically does not make an airtight seal against a printed circuit board at least partly due to obstruction from components mounted on the printed circuit board.

SUMMARY OF THE INVENTION

In one or more embodiments of the present invention, a device adapted to optimize air duct flow in an electronic system comprising a printed circuit board configured to support a plurality of electronic components having various heights, the device comprises, an air duct comprising a rigid cross-sectional member, the air duct being adapted to facilitate air flow from an inlet port to an outlet port, wherein the rigid cross-sectional member comprises an opening having an interior perimeter, the interior perimeter of the opening being attached to a flexible sheet by a pressure sensitive adhesive, wherein the rigid cross-sectional member attached to the flexible sheet is, adapted to compress at least one electronic component from the plurality of electronic components to the printed circuit board when the rigid cross-sectional member is mounted on the printed circuit board; and configured to form an enclosure to optimize air duct flow.

In one or more embodiments of the present invention, a method for optimizing air duct flow in an electronic system comprising a printed circuit board, the printed circuit board being adapted to support a plurality of electronic components having various heights, the method comprises, forming an air duct using a rigid cross-sectional member, cutting out at least one portion of the rigid cross-sectional member to form an opening having an interior perimeter, attaching a flexible sheet to the interior perimeter of the opening with a pressure sensitive adhesive, and compressing the rigid cross-sectional member attached to the flexible sheet against the printed circuit board to form an enclosure for reducing air leakage.

In one or more embodiments of the present invention, a sealing device comprises, a rigid cross-sectional member attached to a flexible sheet by a pressure sensitive adhesive, wherein the flexible sheet is adapted to be compressed against at least one electronic component mounted on a printed circuit board and configured to form an enclosure to optimize air duct flow.

DETAILED DESCRIPTION

Figure 1:
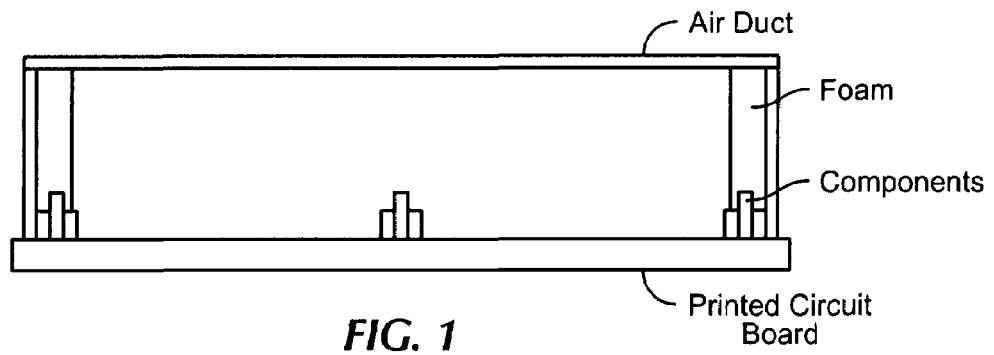
FIG. 1 shows a typical air duct.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to an air duct flow optimization device. More specifically, embodiments of the invention provide a sealing apparatus including a flexible sheet, such as Mylar, attached to an air duct using a pressure sensitive adhesive.

Figure 2:
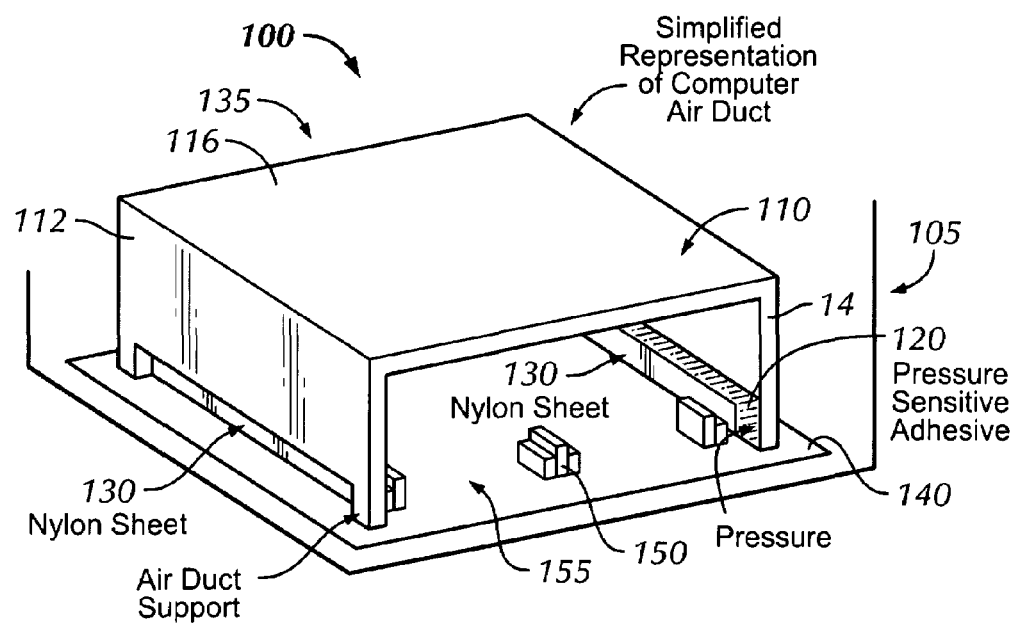
FIG. 2 shows a perspective view of an air duct flow optimization device installed in a computer server in accordance with one or more embodiments of the present invention.

FIG. 2 shows an air duct flow optimization device 100 in accordance with one or more embodiments of the present invention. The air duct flow optimization device 100 includes an air duct 110 having a first lateral side 112 and a second lateral side 14 connected by a cover 116. The cover 116, first lateral side 112, and second lateral side 14 each form a rigid cross-sectional member comprised of, e.g., sheet metal, plastic, or the like. Further, one of ordinary skill in the art will appreciate that the cover 116, the first lateral side 112, and the second lateral side 14 may be integrally or separately formed. In one or more embodiments of the present invention, the air duct 110 may be mounted on a printed circuit board (PCB) 140 which may be supporting numerous electronic components 150 necessary for a computer server 105 to operate. Because the electronic components 150 generate immense amounts of heat, in order to cool down the computer server 105, heat reducing components, e.g., a fan (not shown) and a heat sink (not shown), may each be disposed on either side of the air duct 110, such that the fan is located at an inlet port 135, and the heat sink is located at an outlet port 155.

Because the air duct 110 is mounted on the PCB 140 and bordered on each side by the fan and the heat sink, the air duct 110 acts as an air flow guide from the inlet port 135 to the outlet port 155. However, when the air duct 110 is mounted on the PCB 140, bridging the PCB 140 between the fan and the heat sink, an effective seal must be formed to prevent air leakage which may disrupt the air flowing through the air duct 110, thereby decreasing cooling efficiency. Thus, in one or more embodiments of the present invention, an effective seal will substantially reduce air leakage, thereby optimizing air duct flow.

To create this seal, a flexible sheet 130, e.g., Mylar, is attached to the first lateral side 112 and the second lateral side 14 using a pressure sensitive adhesive 120. Thus, when the air duct 110 is mounted on the PCB 140, the flexible sheet 130 forms an effective seal when compressed on top of the electronic components 150 supported by the PCB 140 preventing leakage of air that is flowing through the air duct 110 from the inlet port 135 to the outlet port 155. Specifically, the flexible sheet 130 may be positioned directly overlying electronic components 150.

The air duct 110 is compressed, for example, by applying a housing cover (not shown) to the cover 116 of air duct 110, compressing the flexible sheet 130 against the electronic components 150. Accordingly, the flexible sheet 130 is pushed downward into contact with the PCB 140 surface and the electronic components 150, creating a effective seal that prevents leakage of air. One of ordinary skill in the art will appreciate that the flexible sheet 130 may be composed of any material having at least flexible properties, e.g., polycarbonate, plastic, or the like. Additionally, those skilled in the art will appreciate that the flexible sheet may be attached to the cover using any manner of fastener, e.g., any type of adhesive, mechanical fasteners, etc.

In one or more embodiments of the present invention, attaching the flexible sheet 130 using the pressure sensitive adhesive 120 to the air duct 110 may require at least a portion of the air duct 110 to be trimmed. For example, FIGS. 3A and 3B each show a side view of the first lateral side 112 of the air duct 110 shown in FIG. 2 without the pressure sensitive adhesive 120 and the flexible sheet 130, in accordance with one or more embodiments of the present invention. In one or more embodiments of the present invention, the first lateral side 112 forms a rigid cross-sectional member comprised of, e.g., sheet metal, plastic, or the like.

Figure 3A:
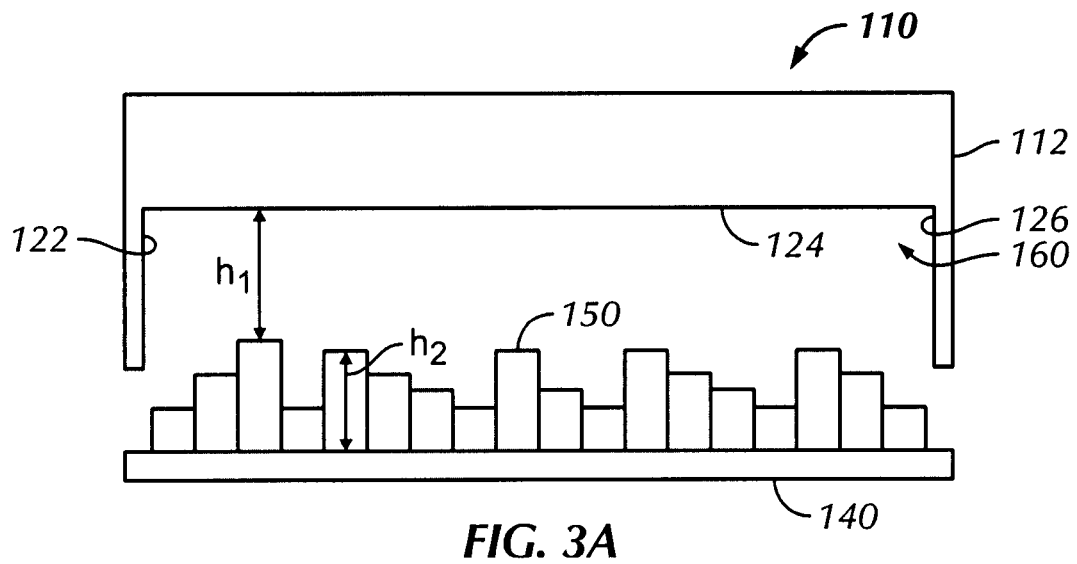
FIGS. 3A-3B show side views of an air duct in accordance with one or more embodiments of the present invention.

Referring to FIG. 3A, an opening 160 is formed in the first lateral side 112, such that the opening 160 includes interior edges 122, 124, and 126 forming an interior perimeter. In one or more embodiments of the present invention, height h1 of the interior edges 122, 126 of the opening 160 is greater than or equal to height h2 of the highest electronic component 150 disposed below the first lateral side of the air duct 110 and mounted on the PCB 140.

Figure 3B:
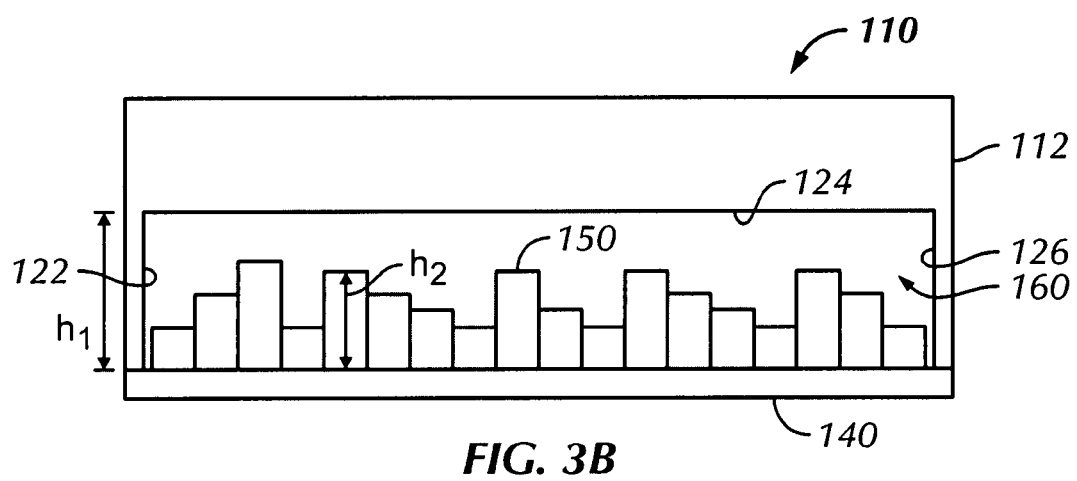

Thus, referring now to FIG. 3B, when the air duct 110 is mounted on the PCB 140, the opening 160 will extend above the highest electronic component 150, such that the interior edge 124 is proximately above and adjacent to the highest electronic component 150. Specifically, the height h1 of the interior edges 122, 126 of the opening 160 is greater than or equal to the height h2 of the highest electronic component 150 disposed below the first lateral side 112 of the air duct 110 and supported by the PCB 140.

In one or embodiments of the present invention, the opening 160 formed in the first lateral side 112 provides space to form an effective seal using the pressure sensitive adhesive 120 and the flexible sheet 130 as described previously with respect to FIG. 2.

Figure 4:
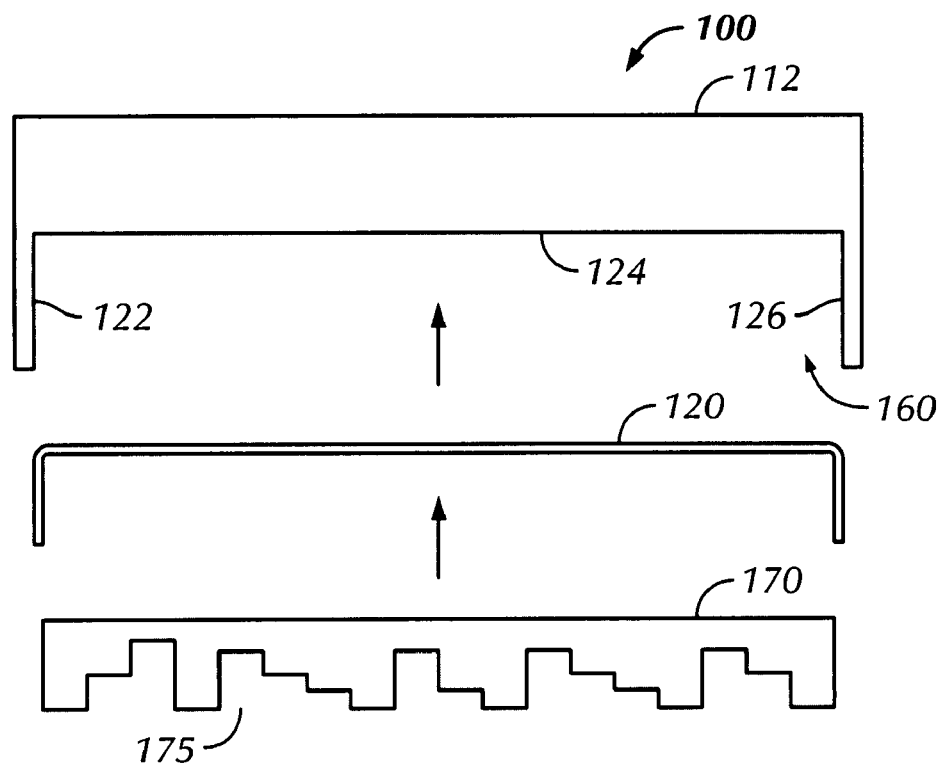
FIG. 4 shows an exploded side view of an air duct flow optimization device in accordance with one or more embodiments of the present invention.

Specifically, FIG. 4 shows an exploded side view of the first lateral side 112 of the air duct flow optimization device 100 shown in FIG. 2 in accordance with one or more embodiments of the present invention. As described previously, the opening 160 is formed in the first lateral side 112, such that the opening 160 includes interior edges 122, 124, and 126 forming an interior perimeter.

In one or more embodiments of the present invention, a flexible sheet 170, e.g., Mylar, is attached to the interior edges, 122, 124, and 126 of the opening 160 using the pressure sensitive adhesive 120. The pressure sensitive adhesive 120 is an adhesive that forms a bond when pressure is applied to attach the first lateral side 112 to the flexible sheet 170. No solvent, water, or heat is needed to activate the pressure sensitive adhesive 120. One of ordinary skill in the art will appreciate that the flexible sheet 170 may be attached to the first lateral side 112 using another type of adhesive with same or similar properties as the pressure sensitive adhesive 120. Also, as previously mentioned, other types of fasteners may be used to attach the flexible sheet to the cover.

Still referring to FIG. 4, a series of gaps 175 are formed in the flexible sheet 170, such that the series of gaps 175 form a distinct contour. One of ordinary skill in the art will appreciate that the flexible sheet 130 may be composed of any material having flexible properties, e.g., polycarbonate, plastic, or the like. Further, one of ordinary skill in the art will also appreciate that while the flexible sheet 170 depicted in FIG. 4 includes the series of gaps 175, the flexible sheet may be formed in a different manner as will be shown in the description for FIG. 6.

In one or more embodiments of the present invention, when the flexible sheet 170 is attached to the distinct contour of the gaps 175 of the first lateral side 112 using the pressure sensitive adhesive 120, the air duct 110 may be mounted on top of the PCB 140 to create an effective seal, i.e., substantially minimizing air leakage, for preventing air leakage from the air flowing through the air duct 110.

Figure 5A:
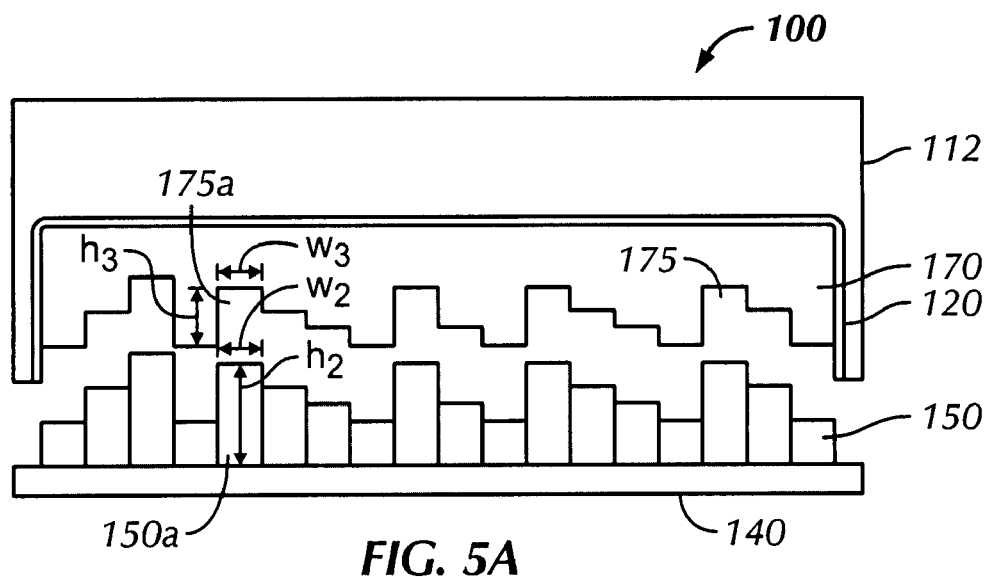
FIGS. 5A-5B show side views of an air duct flow optimization device in accordance with one or more embodiments of the present invention.
Figure 5B:
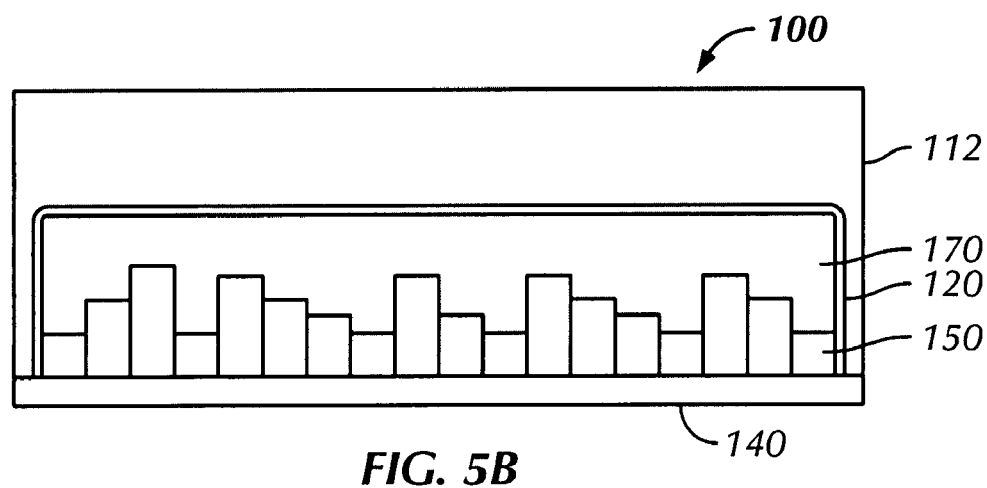

Specifically, FIGS. 5A-5B show side views of before and after stages, respectively, of mounting the air duct flow optimization device 100 described in FIG. 4 onto the PCB 140 supporting numerous electronic components 150, which may have varying heights. Referring to FIG. 5A, a side view of an air duct optimization device 100 is shown in accordance with one or more embodiments of the present invention is shown prior to mounting on the PCB 140 supporting. The air duct flow optimization device 100 includes the first lateral side 112 attached to the flexible sheet 170 using the pressure sensitive adhesive 120. As described above with respect to FIG. 4, the flexible sheet 170 includes a series of gaps 175 formed in the flexible sheet 170, such that the series of gaps 175 forms a distinct contour. Specifically, the series of gaps 175 form a contour equal to the contour of the tops of the electronic components 150, each having various heights, supported by the PCB 140.

In particular, the distinct contour of the series of gaps 175 in the flexible sheet 170 has varying heights greater than or equal to each height of a corresponding electronic component 150 supported by the PCB 140. Further, each horizontal portion of the distinct contour of the series of gaps 175 in the flexible sheet 170 has a width substantially equal to a width of a corresponding electronic component 150 supported by the PCB 140. For example, gap 175a has a height h3 which is greater than or equal to a height h2, and a width w3 which is substantially equal to a width w2, of a corresponding electronic component 150a supported by the PCB 140.

Thus, referring now to FIG. 5B which shows the air duct flow optimization device 100 mounted on top of the PCB 140, the series of gaps 175 in the flexible sheet 170 fit above and around corresponding electronic components 150. In one or more embodiments of the present invention, when the air duct 110 is compressed to the PCB 140, an effective seal, i.e., substantially minimizing air leakage, is formed between the flexible sheet 170 and the electronic components 150 to prevent air leakage from the air flowing through the air duct 110.

Figure 6:
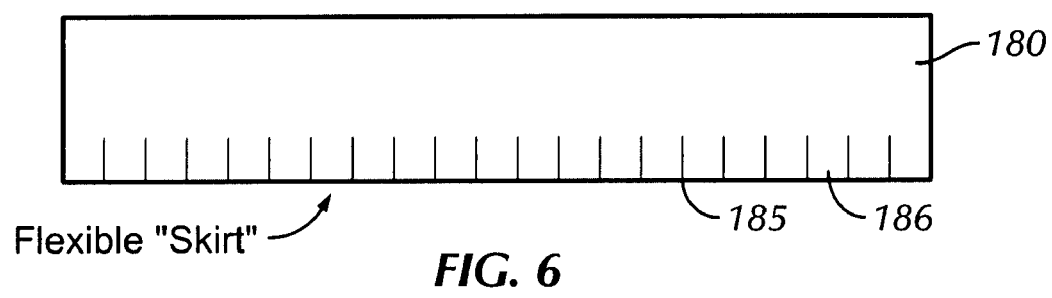
FIG. 6 shows a side view of a flexible sheet in accordance with one or more embodiments of the present invention.

However, in one or more embodiments of the present invention, as discussed previously, a flexible sheet attached to the air duct may take on a variety of different forms. For example, FIG. 6 shows a flexible sheet 180 including a series of apertures 185, thereby dividing a portion of the flexible sheet 180 into a plurality of sections 186 of substantially equal heights. One of ordinary skill in the art will appreciate that the flexible sheet 180 may be, e.g., Mylar or other type of material having at least flexible properties, e.g., polycarbonate, plastic, or the like.

In one or more embodiments of the present invention, when the flexible sheet 180 is attached to the interior edges 122, 124, and 126 of the first lateral side 112 using the pressure sensitive adhesive 120, the air duct 110 may be mounted on top of the PCB 140 to create an effective seal for preventing air leakage.

Figure 7A:
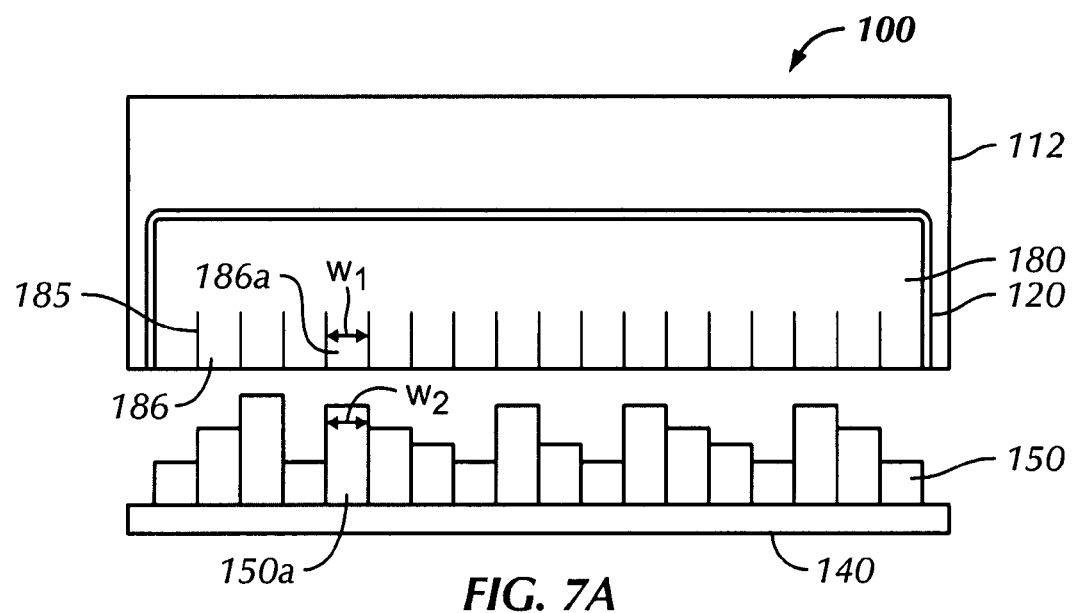
FIGS. 7A-7B show side views of an air duct flow optimization device in accordance with one or more embodiments of the present invention.
Figure 7B:
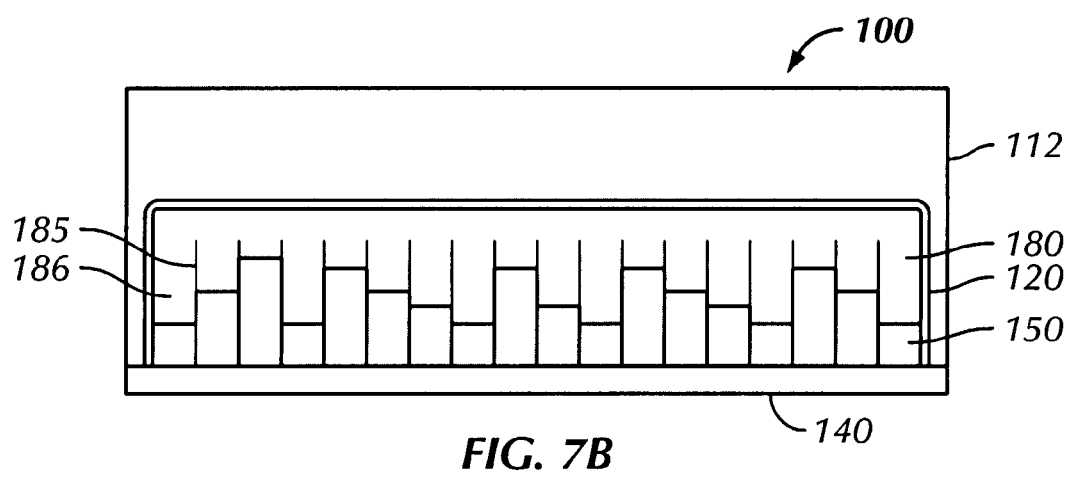

Specifically, FIGS. 7A-7B show side views of before and after stages, respectively, of mounting an air duct flow optimization device 100 using the flexible sheet 180 described in FIG. 6 onto the PCB 140 supporting numerous electronic components 150 which may have varying heights. Referring to FIG. 7A, a side view of an air duct optimization device 100 in accordance with one or more embodiments of the present invention is shown prior to mounting on the PCB 140. The air duct flow optimization device 100 includes the first lateral side 112 attached to the flexible sheet 180 using the pressure sensitive adhesive 120. As described above with respect to FIG. 6, the flexible sheet 180 includes a series of apertures 185, thereby dividing a portion of the flexible sheet 180 into a plurality of sections 186 of substantially equal heights.

In particular, each sections 186 formed by the apertures 185 have a width which is substantially equal to a width of a corresponding electronic component 150 supported by the PCB 140. For example, section 186a has a width w1 substantially equal to width w2 of a corresponding electronic component 150a supported by the PCB 140.

Thus, referring now to FIG. 7B, when the air duct flow optimization device 100 is mounted on top of the PCB 140, each section 186 recoils upwards a distance depending upon the height of each corresponding electronic component 150 it is compressed to for forming an effective seal, i.e., substantially minimizing air leakage, to prevent leakage of air from the air duct 110.

Those skilled in the art will appreciate that numerous variations of the disclosed embodiments may be devised without departing from the scope of the invention. In one or more embodiments of the present invention, the air duct flow optimization device may be used to cool an electronic device such as a server enclosed within a 1 U or 2 U housing. A housing cover may be a typical 1 U or 2 U system cover whereby closing of the cover compresses a flexible sheet, forming an effective seal, i.e., substantially minimizing air leakage, and restraining the air duct against motion or translation relative to the PCB. In one or more embodiments, an air duct flow optimizing apparatus may include one or more flexible sheets attached to either or both the inlet and outlet ports of the air duct to block various orifices, or conformed to various heat reducing components, such as a fan or a heat sink, to form an effective seal.

Additionally, it is not required that a flexible sheet be attached to an opening of an air duct. Rather, the flexible sheet may be attached to a lower surface of the air duct. For example, a flexible sheet may be attached to the lower surface of the air duct using the pressure sensitive adhesive or other fastener, such that the flexible sheet extends below the air duct.

One or more embodiments of the present invention may include one or more of the following advantages. The air flow optimization device may be able to create a substantially airtight seal with the PCB, accommodating various heights of electronic components supported by the PCB, resulting in increased cooling efficiency of air ducts in a computer system. Further, future alteration of electronic component heights may be easily addressed by altering the formation of the flexible sheet. Advantageously, because the flexible sheet is thin, one or more embodiments of the present invention minimizes the impact of electronic components with which the air duct comes in contact with by reducing the contact area. Further, one or more embodiments of the present invention significantly increases cooling efficiency by eliminating air flow leakages while being low in cost as a flexible sheet is relatively inexpensive, and the air duct flow optimization device itself requires minimum components.

While the present invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A device adapted to optimize air duct flow in an electronic system comprising a printed circuit board configured to support a plurality of electronic components having various heights, the device comprising:
    an air duct comprising a rigid cross-sectional member, the air duct being adapted to facilitate air flow from an inlet port to an outlet port;
    wherein the rigid cross-sectional member comprises an opening that is open to a direction perpendicular to the air duct flow and parallel to the printed circuit board having an interior perimeter, the interior perimeter of the opening being attached to a flexible sheet by a fastener;
    wherein the rigid cross-sectional member attached to the flexible sheet is adapted to compress against at least one electronic component from the plurality of electronic components to the printed circuit board when the rigid cross-sectional member is mounted on the printed circuit board; and
    wherein the rigid cross-section member is configured to form an enclosure that optimizes air duct flow.

2. The device according to claim 1, wherein the opening of the rigid cross-sectional member is adapted to be disposed above and adjacent to at least one electronic component having a height greater than either of the electronic components disposed in a receiving area, the receiving area being a space on the printed circuit board configured to receive the rigid cross-sectional member when the air duct is mounted on top of the printed circuit board.

3. The device according to claim 1, wherein a portion of the flexible sheet comprises a plurality of gaps adapted to be disposed above and adjacent to corresponding electronic components when the air duct is mounted on top of the printed circuit board.

4. The device according to claim 1, wherein the flexible sheet is a Mylar sheet.

5. The device of claim 1, wherein the fastener is a pressure sensitive adhesive.

6. A device adapted to optimize air duct flow in an electronic system comprising a printed circuit board configured to support a plurality of electronic components having various heights, the device comprising:
an air duct comprising a rigid cross-sectional member, the air duct being adapted to facilitate air flow from an inlet port to an outlet port;
wherein the rigid cross-sectional member comprises an opening having an interior perimeter, the interior perimeter of the opening being attached to a flexible sheet by a fastener;
wherein the rigid cross-sectional member attached to the flexible sheet is adapted to compress against at least one electronic component from the plurality of electronic components to the printed circuit board when the rigid cross-sectional member is mounted on the printed circuit board; and configured to form an enclosure that optimizes air duct flow; and
wherein the flexible sheet comprises a plurality of apertures, thereby dividing a portion of the flexible sheet into a plurality of sections of substantially equal heights; and wherein each of the sections of the flexible sheet are adapted to be disposed above and adjacent to corresponding electronic components when the air duct is mounted on top of the printed circuit board and each section comes into contact with corresponding electronic components.

7. A method for optimizing air duct flow in an electronic system comprising a printed circuit board, the printed circuit board being adapted to support a plurality of electronic components having various heights, the method comprising:
forming an air duct using a rigid cross-sectional member;
cutting out at least one portion of the rigid cross-sectional member to form an opening that is open to a direction perpendicular to the air duct flow and parallel to the printed circuit board having an interior perimeter;
attaching a flexible sheet to the interior perimeter of the opening with a fastener; and
compressing the rigid cross-sectional member attached to the flexible sheet against the printed circuit board to form an enclosure that optimizes air duct flow.

8. The method according to claim 7, wherein cutting out at least one portion of the rigid cross-sectional member comprises cutting the opening to at least a height adapted to be disposed above and adjacent to at least one electronic component having a height greater than either of the electronic components disposed in a receiving area, the receiving area being a space on the printed circuit board configured to receive the rigid cross-sectional member when the air duct is compressed to the printed circuit board.

9. The method according to claim 7, further comprising: forming a plurality of gaps in a portion of the flexible sheet, each of the plurality of gaps being adapted to be disposed above and adjacent to corresponding electronic components when the air duct is mounted on top of the printed circuit board.

10. The method of claim 7, wherein the fastener is a pressure sensitive adhesive.

11. A method for optimizing air duct flow in an electronic system comprising a printed circuit board, the printed circuit board being adapted to support a plurality of electronic components having various heights, the method comprising:
forming an air duct using a rigid cross-sectional member;
cutting out at least one portion of the rigid cross-sectional member to form an opening having an interior perimeter;
attaching a flexible sheet to the interior perimeter of the opening with a fastener;
compressing the rigid cross-sectional member attached to the flexible sheet against the printed circuit board to form an enclosure that optimizes air duct flow; and
forming a plurality of apertures in the flexible sheet, thereby dividing a portion of the flexible sheet into a plurality of sections of substantially equal heights, each of the sections of the flexible sheet being adapted to be disposed above and adjacent to corresponding electronic components when the air duct is mounted on top of the printed circuit board and each section comes into contact with corresponding electronic components.

12. A sealing device comprising:
a rigid cross-sectional member attached to a flexible sheet by a fastener;
wherein the flexible sheet is adapted to be compressed against at least one electronic component of a plurality of electronic components mounted on a printed circuit board and configured to form an enclosure to optimize air duct flow; and
the sealing device further comprising an opening in the rigid cross-sectional member that is open to a direction perpendicular to the air duct flow and parallel to the printed circuit board, wherein the flexible sheet is attached to the opening with the fastener.

13. The sealing device according to claim 12, wherein the opening of the rigid cross-sectional member is adapted to be disposed above and adjacent to at least one electronic component having a height greater than either of the electronic components disposed in a receiving area, the receiving area being a space on the printed circuit board configured to receive the rigid cross-sectional member when the air duct is mounted on the printed circuit board.

14. The sealing device according to claim 12, wherein a portion of the flexible sheet comprises a plurality of gaps adapted to be disposed above and adjacent to corresponding electronic components when the air duct is mounted on top of the printed circuit board.

15. The sealing device according to claim 12, wherein the flexible sheet is a Mylar sheet.

16. The sealing device according to claim 12, wherein the fastener is a pressure sensitive adhesive.

17. A sealing device comprising:
a rigid cross-sectional member attached to a flexible sheet by a fastener;
wherein the flexible sheet is adapted to be compressed against at least one electronic component mounted on a printed circuit board and configured to form an enclosure to optimize air duct flow; and
wherein the flexible sheet comprises a plurality of apertures, thereby dividing a portion of the flexible sheet into a plurality of sections of substantially equal heights; and wherein each of the sections of the flexible sheet are adapted to be disposed above and adjacent to corresponding electronic components when the air duct is mounted on top of the printed circuit board and each section comes into contact with corresponding electronic components.

* * * * *